(12) United States Patent
Levitsky et al.

(10) Patent No.: US 7,930,675 B2
(45) Date of Patent: Apr. 19, 2011

(54) METHOD AND SYSTEM FOR IMPLEMENTING TIMING ANALYSIS AND OPTIMIZATION OF AN ELECTRONIC DESIGN BASED UPON EXTENDED REGIONS OF ANALYSIS

(75) Inventors: Oleg Levitsky, San Jose, CA (US); Kit Lam Cheong, Palo Alto, CA (US); Wilson Chan, San Mateo, CA (US); Dongzi Liu, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 518 days.

(21) Appl. No.: 11/964,678

(22) Filed: Dec. 26, 2007

(65) Prior Publication Data

US 2009/0172619 A1 Jul. 2, 2009

(51) Int. Cl.
*G06F 17/50* (2006.01)
*G06F 9/455* (2006.01)

(52) U.S. Cl. .................. 716/134; 716/113; 716/115

(58) Field of Classification Search .............. 716/6, 113, 716/115, 134
See application file for complete search history.

(56) References Cited

U.S. PATENT DOCUMENTS

| | | | |
|---|---|---|---|
| 6,578,183 B2 | 6/2003 | Cheong et al. | |
| 6,615,395 B1 * | 9/2003 | Hathaway et al. | 716/6 |
| 6,704,697 B1 | 3/2004 | Berevoescu et al. | |
| 7,000,206 B2 * | 2/2006 | Kidd et al. | 716/6 |
| 7,216,312 B2 * | 5/2007 | Jain et al. | 716/4 |
| 7,216,316 B1 * | 5/2007 | Sutherland et al. | 716/6 |
| 7,398,491 B2 * | 7/2008 | Schaeffer et al. | 716/4 |
| 2006/0112359 A1 * | 5/2006 | Becer et al. | 716/6 |
| 2006/0248485 A1 * | 11/2006 | Foreman et al. | 716/6 |
| 2007/0283305 A1 * | 12/2007 | Reddy et al. | 716/6 |
| 2009/0044159 A1 * | 2/2009 | Vinitzky et al. | 716/6 |
| 2009/0055787 A1 * | 2/2009 | Oh et al. | 716/6 |
| 2009/0132982 A1 * | 5/2009 | Kotecha et al. | 716/6 |

OTHER PUBLICATIONS

U.S. Appl. No. 11/621,915, filed Jan. 9, 2007.
U.S. Appl. No. 11/733,749, filed Apr. 10, 2007.

* cited by examiner

*Primary Examiner* — Stacy A Whitmore
(74) *Attorney, Agent, or Firm* — Vista IP Law Group LLP

(57) ABSTRACT

Operations are performed in EDA tools that operate upon partitions or discrete portions of an electronic design, in which the partitions or discrete portions of the design are expanded to account for effects to/from other areas in the design. Identification is made of the portions of the design that are external to the partitions, and depending upon the type of expected effects, would then be considered during optimization and analysis of the partitions. This is implemented by logically expanding the partition to include consideration of the external portions during timing optimization and analysis. By considering an expanded partition for timing optimization and analysis, it is possible to identify unintended problems caused by the timing optimization at an earlier stage of the design process.

25 Claims, 14 Drawing Sheets

Goto Fig. 4B

Goto Fig. 6B

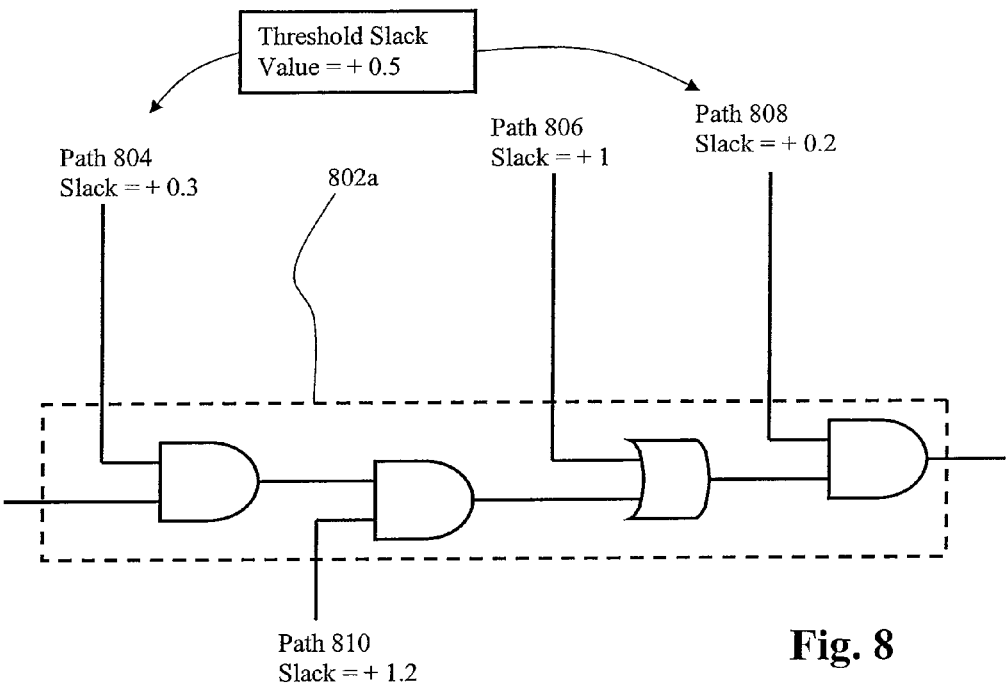
Fig. 8
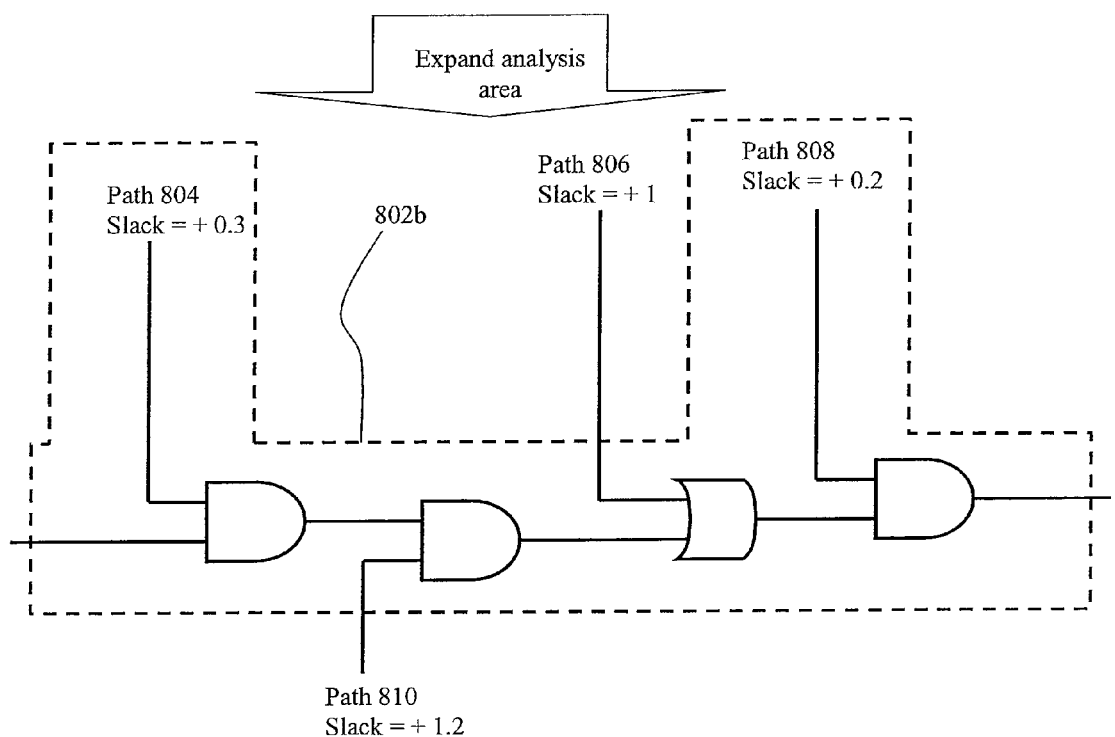

METHOD AND SYSTEM FOR IMPLEMENTING TIMING ANALYSIS AND OPTIMIZATION OF AN ELECTRONIC DESIGN BASED UPON EXTENDED REGIONS OF ANALYSIS

FIELD OF THE INVENTION

The invention pertains to the design, analysis, and optimization of electrical designs, and in particular, to timing analysis and optimization of electrical designs.

BACKGROUND OF THE INVENTION

One aspect of integrated circuit design that is critical for circuit performance is the timing of the circuit elements, interconnects, and nets within the circuit. As very large scale integrated circuit (VLSI) fabrication technology reaches submicron device dimensions and circuit speed falls into the sub-nanosecond range, timing delays become more and more important as factors in determining circuit speed and performance.

Currently, the design of electronic circuits and systems employs computer-automated design systems (also known as electronic design automation or EDA tools) for defining and verifying various circuit configurations. Typically, circuit definition is accomplished by graphically entering circuit schematics at an engineering workstation or by using a logic synthesis tool, which generates a high-level, hardware description file functionally describing the logic of the desired prototype circuit. As part of the circuit definition, a number of delay constraints are specified by the circuit designer. These delay constraints must be satisfied when the circuit is designed and fabricated.

A computer-aided timing analysis tool can be used to estimate propagation delays through each net or a section of a net in a signal path. When an unacceptable delay is identified, optimization may be performed to correct the timing delay problems. For example, timing optimizations in a circuit may be performed by modifying a critical net to include additional buffers, repeaters, or by resizing gates within the net to address a timing problem.

As the quantity of data in modern integrated circuit (IC) designs become larger and larger over time, the execution time required to process EDA tools upon these IC designs also becomes greater. With respect to the process of performing timing analysis and optimization, the more circuit elements that are on an IC design, the greater amounts of time and resources that are needed that are normally needed to identify and correct the timing problems. This problem is exacerbated by constantly improving IC manufacturing technologies that can create IC chips at ever-smaller feature sizes, which allows increasingly greater quantities of circuit elements to be placed within the same chip area which may cause greater numbers of timing problems.

To achieve faster and more efficient results, it is therefore desirable to perform EDA processing upon an IC layout without having to consider the entirety of the circuit design. Instead, it is desirable to be able to analyze and optimize discrete portions of the circuit design.

A typical approach to solve large analysis problems is with a divide and conquers approach, such as partitioning or hierarchical approaches. The partitioning or hierarchical analysis approaches divide a large circuit design into smaller manageable portions, and then separately analyzes and optimizes these circuit portions. The partitioning approach essentially breaks the design into a set of discrete partitions. The hierarchical approach divides a flat circuit design into separate portions based upon hierarchical partitioning.

The problem is that the partitioning approaches taken by existing EDA tools/techniques may negatively affect timing if certain areas of the design external to the partitions are not considered for the optimization. For example, if the optimization only considers a given portion of the design, i.e., certain partitions, and those portions affect or are affected by other portions of the design, then optimization taken in isolation may cause unintended effects upon the timing both within the analyzed/optimized partitions as well as in the not-considered partitions.

This type of problem could cause extra iterations to be performed in the design/timing process to correct the unintended problems. This in turn can significantly affect the designer in the processing of the design cycle both financially and in terms of product timing and release.

Therefore, there is a need for an improved approach for handling partitions that addresses external portions of the overall design that would be affected by processing and optimization of the contents of the partitions.

SUMMARY

Embodiments of the present invention allow operations to be performed in EDA tools that operate upon partitions or discrete portions of an electronic design, in which the partitions or discrete portions of the design are expanded to account for effects to/from other areas in the design. Identification is made of the portions of the design that are external to the partitions, and depending upon the type of expected effects, would then be considered during optimization and analysis of the partitions. In some embodiments, this is implemented by logically expanding the partition to include consideration of the external portions during timing optimization and analysis. By considering an expanded partition for timing optimization and analysis, it is possible to identify unintended problems caused by the timing optimization at an earlier stage of the design process. This results in a design process that is more efficient, faster, and that potentially provide improved results. Moreover, this can result in improved system performance and a smaller memory footprint.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

FIG. 8 illustrate a circuit portion for analysis and optimization that is extended based upon slack according to some embodiments of the invention.

DETAILED DESCRIPTION

Embodiments of the present invention allow operations to be performed in EDA tools that operate upon partitions or discrete portions of an electronic design, in which the partitions or discrete portions of the design are expanded to account for effects to/from other areas in the design. In general, this is accomplished in some embodiments by identifying the portions of the design, external to the partitions that should be considered during optimization and analysis of the partitions. The partitions can be logically expanded to include consideration of the external portions during timing optimization and analysis.

By considering an expanded partition for timing optimization and analysis, it is possible to identify unintended problems caused by the timing optimization at an earlier stage of the design process. This results in a design process that is more efficient, faster, and that potentially provide improved results. Moreover, this can result in improved system performance and a smaller memory footprint.

Figure 1:
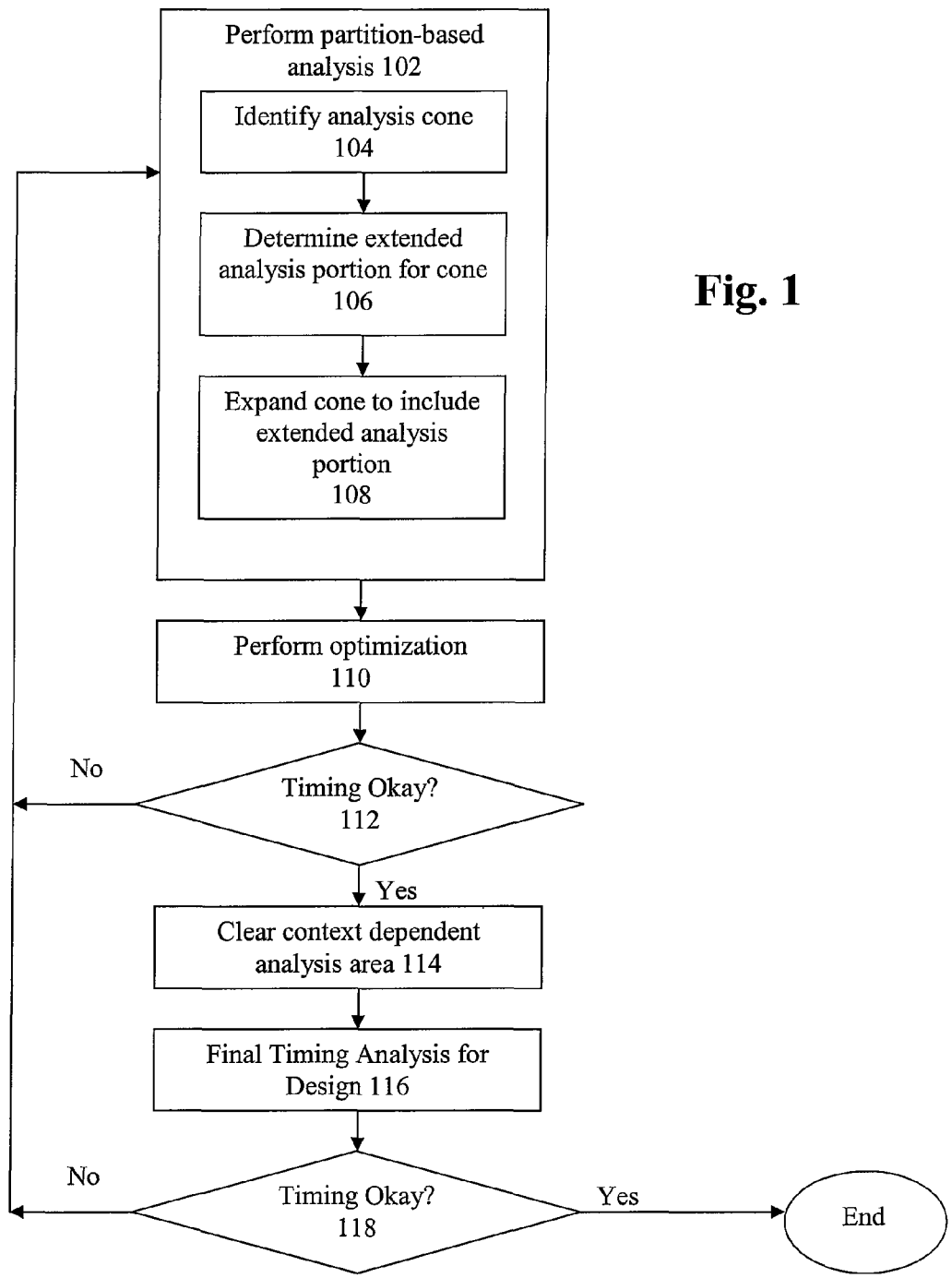
FIG. 1 shows a flow for implementing a process for performing timing analysis and optimization based upon extended analysis cones according to some embodiments of the invention.

FIG. 1 shows a high level flowchart of an embodiment of the invention. At 102, the embodiment begins by analyzing a large electrical design in which the design is partitioned into smaller portions. One exemplary approach that can be employed to perform this type of analysis is by performing a partition-based analysis where, instead of physically portioning the design into different partitions based upon inflexible tiles or windows that are based upon fixed sizes or coordinate locations, the approach creates partitions by identifying an analysis "cone", which is a portion of the design that can discretely analyzed and optimized, while still being able to view the entire design (104). The advantage of this approach is that it does not require an inflexible physical partitioning of the design. Instead, the portions or areas of analysis can be flexibly configured to form analysis cones that cover areas of interest. The analysis cone can be defined based upon any suitable criteria. For example, the analysis cone can be defined based upon user request/requirement, design stage, specific flow of activity, or other analysis criteria. Example approaches for implementing this type of partitioning are described in co-pending U.S. patent application Ser. No. 11/621,915, entitled SYSTEM AND METHOD OF GENERATING HIERARCHICAL BLOCK-LEVEL TIMING CONSTRAINTS FROM CHIP-LEVEL TIMING CONSTRAINTS, filed on Jan. 9, 2007, and U.S. patent application Ser. No. 11/733,749, entitled SYSTEM AND METHOD OF COMPUTING TIMING PIN CRITICALITIES UNDER PROCESS VARIATIONS FOR TIMING ANALYSIS AND OPTIMIZATION, filed on Apr. 10, 2007, which are hereby incorporated by reference in their entirety. For purposes of illustration, embodiments of the present invention will be described in the context of performing this type of partitioning. It is noted, however, that the inventive concepts disclosed herein may be utilized in conjunction with any partitioning approach and is not to be limited to the illustrated examples unless claimed as such. In addition, the underlying techniques described herein can be employed for any distributed or parallel process that works upon different partitions of a design.

Next, an extended analysis portion is defined for the analysis cone (106). The general idea is to attempt to minimize the amount of the design that must be analyzed and optimized, while still taking into account any significant and/or appreciable effects upon other portions of the circuit design. The extended analysis portion will include additional portions of the overall design that will be affected or will affect timing based upon optimization of the circuit element within the analysis cone. Once the additional portions of the circuit design have been identified, the analysis cone is expanded to include those additional design portions (108).

Timing analysis and optimization are then performed upon the analysis cone (110). Any suitable approach can be taken to perform this type of optimization, including the approaches described in co-pending U.S. patent application Ser. No. 11/621,915, filed on Jan. 9, 2007, and U.S. patent application Ser. No. 11/733,749, filed on Apr. 10, 2007, which are hereby incorporated by reference in their entirety.

A determination is made whether the timing is acceptable (112). If the timing optimization was not successful, then return back to 102 to repeat the prior actions. If however, timing is acceptable, then this means that timing optimization was successful.

If the timing optimization was successful, then the process retreats from the focus upon a discrete portion of the design, e.g., will "clear" the partitioned analysis area (114). This means that the focus will return back to the full design. At this point, the timing is checked for the entire design (116). If timing is acceptable (118), then the process ends. If timing is unacceptable, then return back to 102 to repeat the prior actions.

Figure 2:
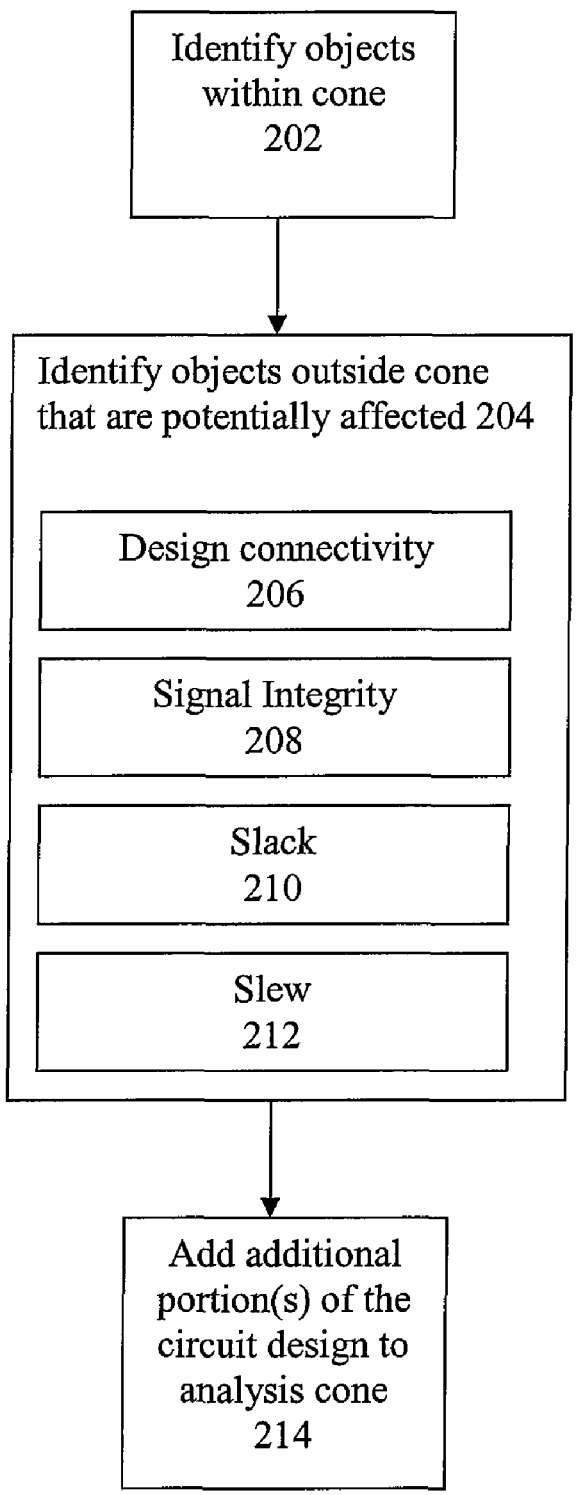
FIG. 2 shows a flow for extending an analysis cones according to some embodiments of the invention.

FIG. 2 provides additional details for extending the area of analysis according to some embodiments of the invention. First, identification is made of objects within the analysis cone (202). The scope and contents of an analysis cone may be based upon any suitable criteria, e.g., based upon a physical area of the design or upon one or more signal paths. In many cases, the analysis cone may include sequences of logic gates. If the analysis cone includes sequences of logic gates, then action 202 will identify at least those logic gates.

Next, identification is made of the additional portions of the electrical design that will be affected or will affect timing based upon optimization of the identified objects within the analysis cone (204). Numerous factors may be considered when attempting to identify the additional portions of the design. For example, design connectivity can be considered to identify additional portions of the circuit design to include within the analysis cone (206). This will identify any additional portions of the design that are physically connected in a relevant way to the objects within the analysis cone. Signal integrity considerations can be made to identify additional portions of the design (208). Slack issues can be analyzed to identify other portions of the design to include within the analysis cone (210). Slew rates for other portions of the design can also be considered to identify additional portions to add to the analysis cone (212). It is noted that this section is merely providing a list of example factors that can be considered when expanding the analysis cone; any other suitable factors may also be considered when expanding the analysis cone.

Certain thresholds can be established for these factors to determine the proper amount of effect that needs to be considered in identifying of the regions to include within the analysis cone. Based upon these factors, identification is made of the additional portions of the circuit design that is to be added to the analysis cone (214).

Figure 3:
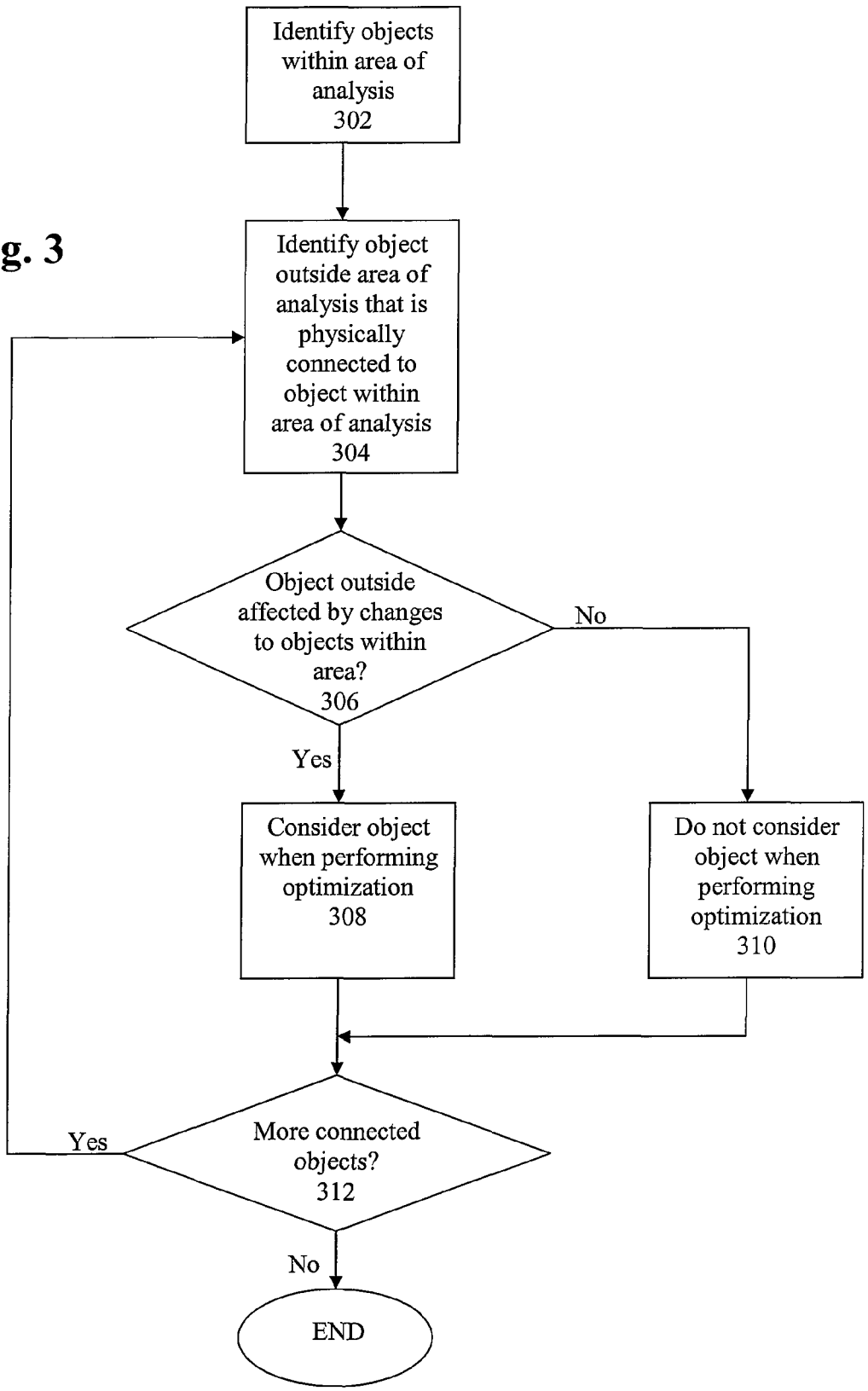
FIG. 3 shows a flow for extending an analysis cones based upon design connectivity according to some embodiments of the invention.

FIG. 3 shows a flowchart of an approach for considering design connectivity when expanding an analysis cone according to some embodiment of the invention. At 302, identification is made of objects within the analysis cone. If the analysis cone includes sequences of logic gates, then action 302 will identify at least those logic gates.

Next, identification is made of objects outside of the analysis area of the analysis cone that are physically connected to objects within the analysis cone (304). If the analysis cone includes gates having multiple inputs and outputs, then it is likely that some of those inputs or outputs lead to structures that are outside of the analysis cone. This action traces those inputs and outputs to identify any objects that are physically connected but are outside of the analysis cone.

For each identified object, a determination is made whether the identified object outside of the analysis cone could potentially be negatively affected for timing based upon any optimizations to objects within the analysis cone (306). If so, then the object will be "considered" during optimization by being added to the expanded analysis cone (308). If not, then it will not be added to the analysis cone (310).

The process will then determine whether there are any additional objects that have been identified as being outside of the analysis area of the analysis cone but are physically connected to objects within the analysis cone (312). If so, then return back to 304 to continue processing the identified object(s).

Figure 4A:
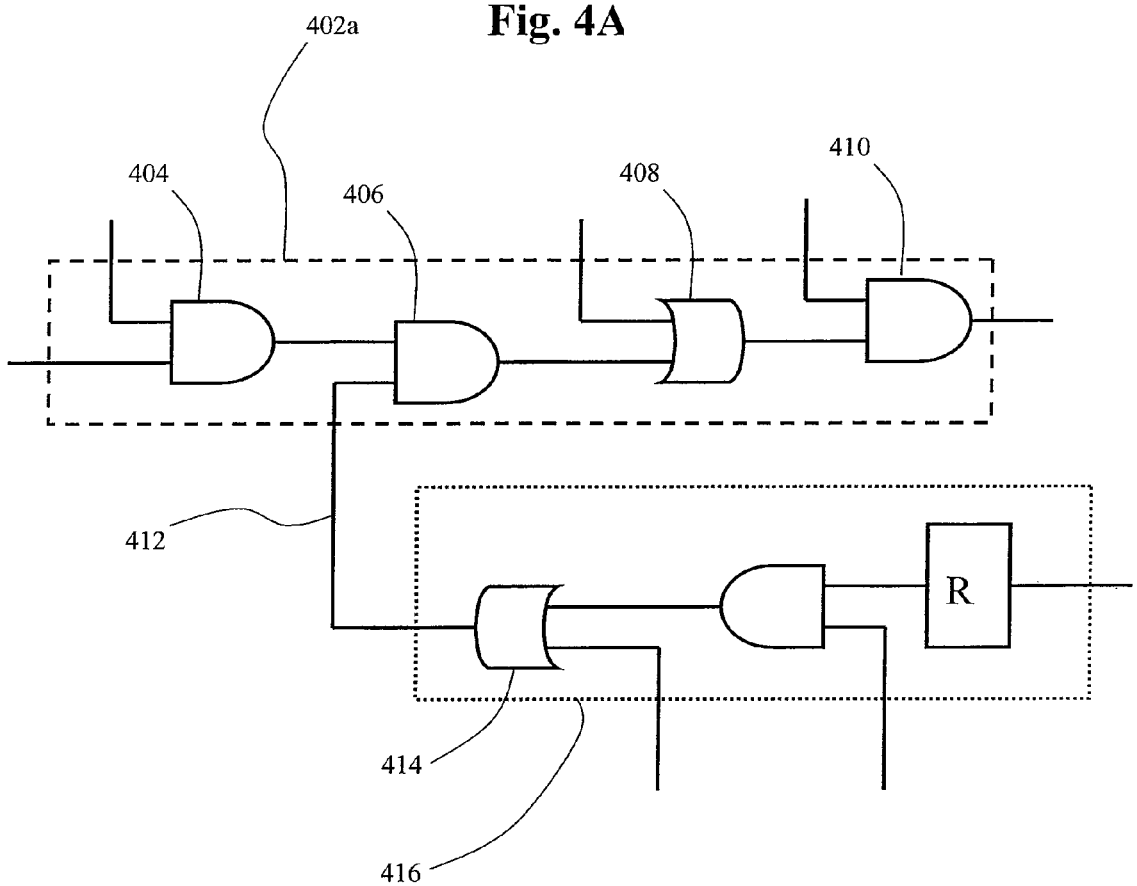
FIGS. 4A-B illustrate a circuit portion for analysis and optimization that is extended based upon design connectivity according to some embodiments of the invention.

FIG. 4A provides an illustrated example of the process of FIG. 3 for considering design connectivity when expanding an analysis cone. The approach starts by identifying objects within the analysis cone, and then identifying objects outside of the analysis area of the analysis cone that are physically connected to objects within the analysis cone.

As shown in the example of FIG. 4A, an analysis cone 402a has been created that includes gates 404, 406, 408, and 410. If the analysis cone includes gates having multiple inputs and outputs, then those inputs or outputs can be traced to identify any objects that are physically connected but are outside of the analysis cone.

Here, the gates within the analysis cone 402a include multiple inputs connections, which can be traced to identify physically connected structures that are outside of analysis cone 402a. For example, gate 406 is within analysis cone 402a, but includes an input connection 412 that leads to a gate 414. Gate 414 is part of a signal path 416 that is entirely outside of analysis cone 402a.

For objects outside of the analysis cone that are identified as being physically connected to objects within the analysis cone, a determination is made whether the timing associated with the identified object outside of the analysis cone might be negatively affected based upon any optimizations to objects within the analysis cone. The question for this example is whether the timing for signal path 416 might be negatively affected by optimizations made to gate 406 within analysis cone 402a.

In this case, it is possible for the timing along signal path 416 to be negatively affected by optimizations made to gate 406 within analysis cone 402a. As just one example situation, consider if gate re-sizing is performed upon gate 406 to implement timing optimization within analysis cone 402a. If gate 406 is re-sized, a load increase may occur at gate 406, which causes a corresponding increase in load along signal path 416. While this optimization to re-size gate 406 may significantly improve timing for the signal path within analysis cone 402a, the increased load may also cause signal path 416 to fail timing requirements for the circuit design. If the EDA tool only considers the objects within analysis cone 402a when performing timing optimization, and does not consider objects outside of the analysis cone 402a such as signal path 416, then this potential timing problem will not be caught right away, and indeed may only be noticed significantly later in the design cycle when it is much more expensive to fix the problem.

Figure 4B:
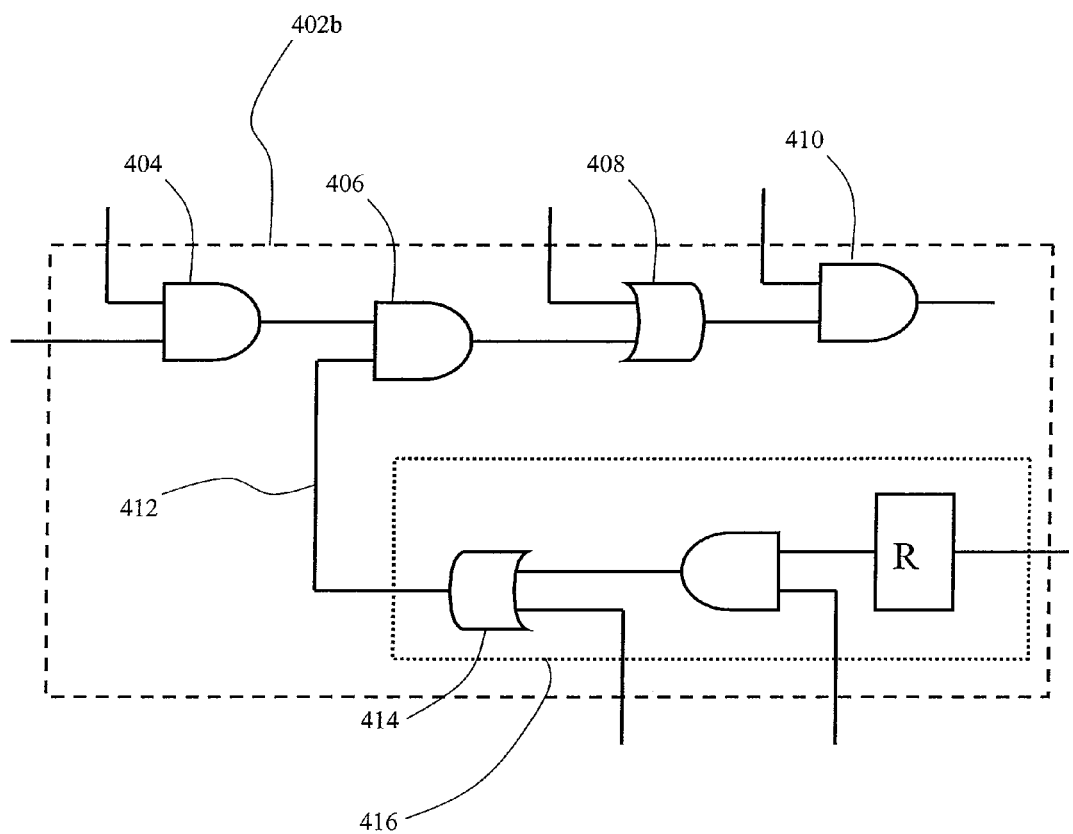

With embodiments of the present invention, the potential problem is identified upfront based upon recognition of the physical connection between signal path 416 and gate 406 within analysis cone 402a. As shown in FIG. 4B, analysis cone 402a can be effectively expanded as analysis cone 402b to include consideration of the external signal path 416 that is physically connected to gate 406. During timing analysis and optimization, any modifications to gate 406 can now be analyzed with respect to its effect upon signal path 416. To the extent such modifications could negatively affect timing for signal path 416, then gate 406 could be identified as a gate as ineligible for optimization and should therefore not be modified during timing optimization. Instead, other gates would be weighted or prioritized to be optimized instead of gate 406.

Figure 5:
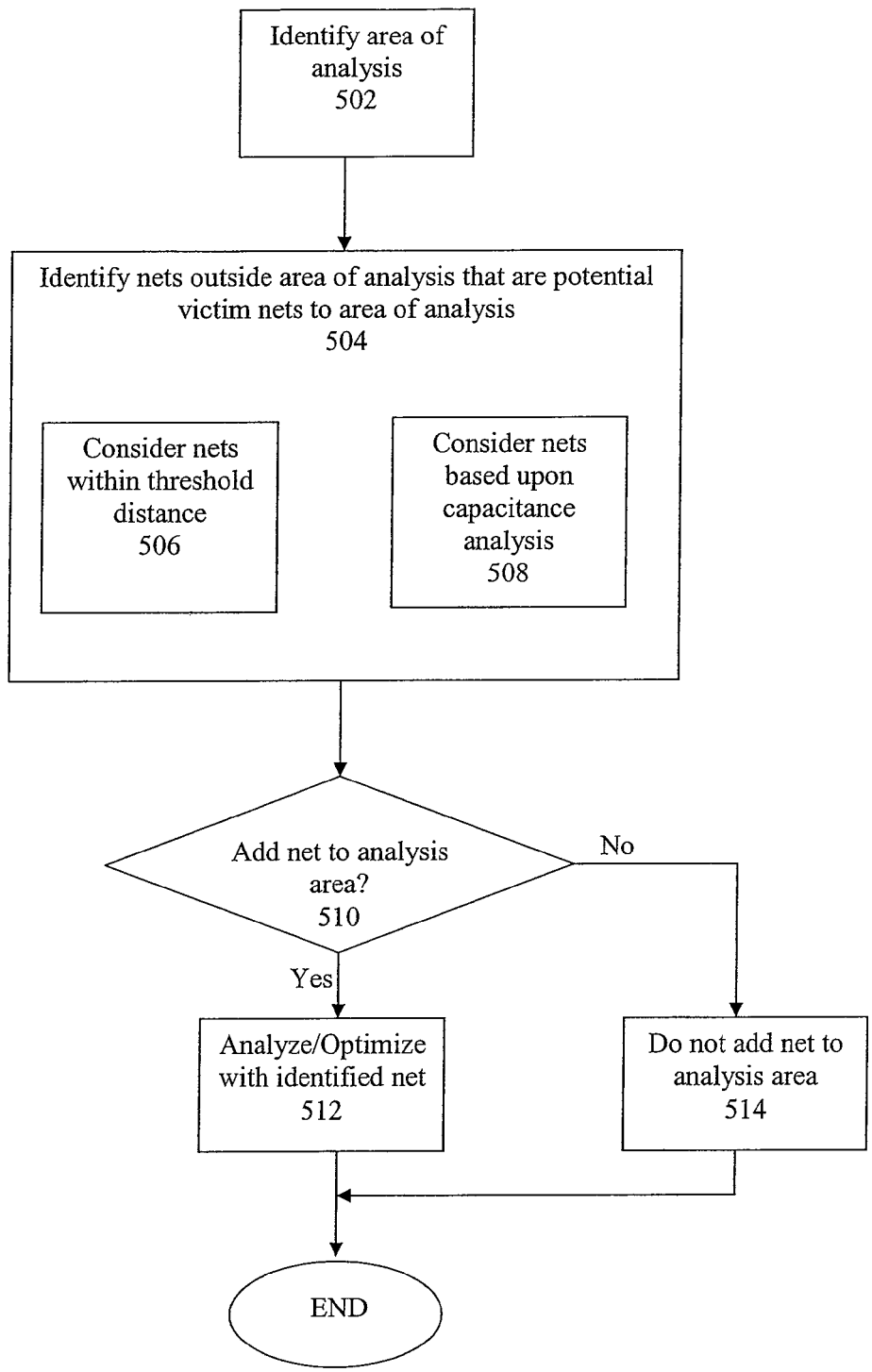
FIG. 5 shows a flow for extending an analysis cones based upon signal integrity according to some embodiments of the invention.

FIG. 5 shows a flowchart of an approach for considering signal integrity when expanding an analysis cone according to some embodiment of the invention. Modifications made to objects and structures within the analysis cone may negatively the signal integrity of nets outside of the analysis cone. To the extent any of those external signal paths are susceptible to signal integrity problems based upon changes and modification to the analysis cone, then it would be helpful to identify those external signal paths and to consider those external signal paths when making timing optimizations to the analysis cone.

At 502, identification is made of objects within the analysis cone. If the analysis cone includes sequences of logic gates, then action 502 will identify at least those logic gates. Identification is made of nets outside of the contents of the analysis cone that could suffer from signal integrity problems based upon changes made to objects within the analysis cone (504). This action will, for example, identify the nets that might potentially qualify as victim nets based upon the electrical effects of the net(s) within the analysis cone.

There are numerous possible ways to identify the external nets that might qualify as victim nets. For example, a simplistic approach would merely identify all nets within a threshold distance from the nets within the analysis cone (506). The threshold distance should be selected to be close enough to conservatively identify nets that may be affected from a signal integrity point of view. A more sophisticated approach would perform electrical analyses to determine the electrical and capacitance effects of the potential modifications upon the external nets (508). Any suitable approach can be made to determine the external nets of interest.

For each identified net, a determination is made whether the identified net outside of the analysis cone could potentially be negatively affected for timing based upon any optimizations to objects within the analysis cone (510). In other words, a determination is made whether any of the identified nets could suffer signal integrity problems based upon modifications and modifications to the analysis cone. If so, then the net will be considered during optimization by being added to the expanded analysis cone (512). If not, then the net will not be added to the analysis cone (514).

Figure 6A:
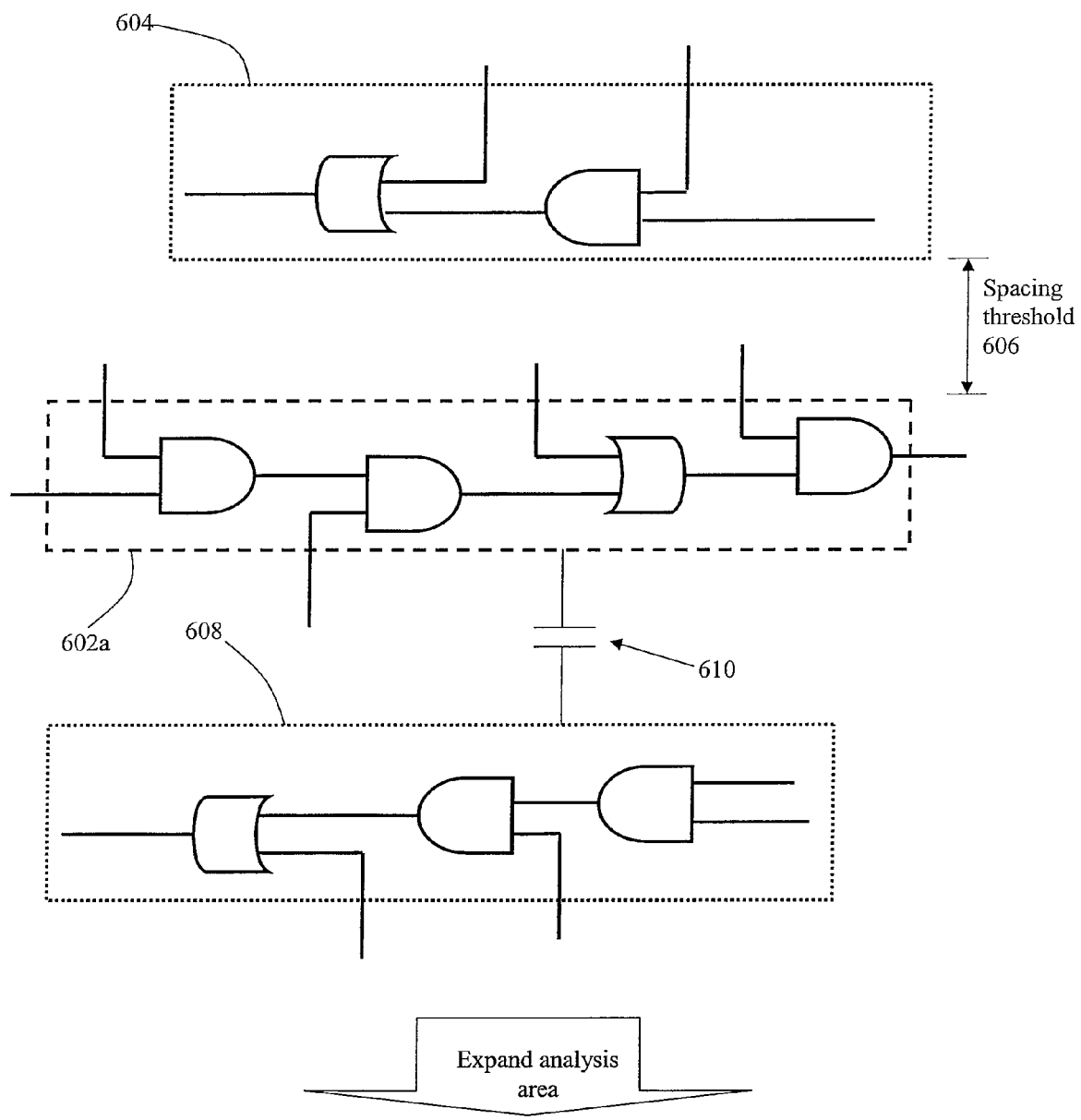
FIGS. 6A-B illustrate a circuit portion for analysis and optimization that is extended based upon signal integrity according to some embodiments of the invention.

FIG. 6A provides an illustrated example of the process of FIG. 5 for considering signal integrity when expanding an analysis cone. As shown in the example of FIG. 6A, an analysis cone 602a has been created that includes a net having multiple gates and interconnects.

Two approaches are illustrated for identifying potential signal integrity problems that could be related to analysis cone 602a. In the first simplistic approach, identification is made of all nets within a threshold distance 606 from the nets within the analysis cone. In the present example, it can be seen that net 604 is close enough to analysis cone 602a to be within the threshold spacing distance 606.

In the second approach, electrical analysis is performed to determine the electrical and capacitance effects of the potential modifications upon the external nets. For the present example, electrical analysis and extraction is performed to determine the electrical/capacitance effects 610 upon a net 608 based upon potential modifications to nets within analysis cone 602a. Here, it is assumed that electrical analysis confirms that the signal integrity of net 608 could be negatively affected by modifications to nets within analysis cone 602a.

Therefore, it is confirmed that there are nets outside of analysis cone 602a that could be negatively affected by optimizations made to nets and electrical structures within analysis cone 602a. If the EDA tool only considers the objects and nets within analysis cone 602a when performing timing optimization, and does not consider nets outside of the analysis cone 602a, then this potential signal integrity problems outside of analysis cone 602a will not be caught right away, and may only be identified and corrected later in the design cycle.

Figure 6B:
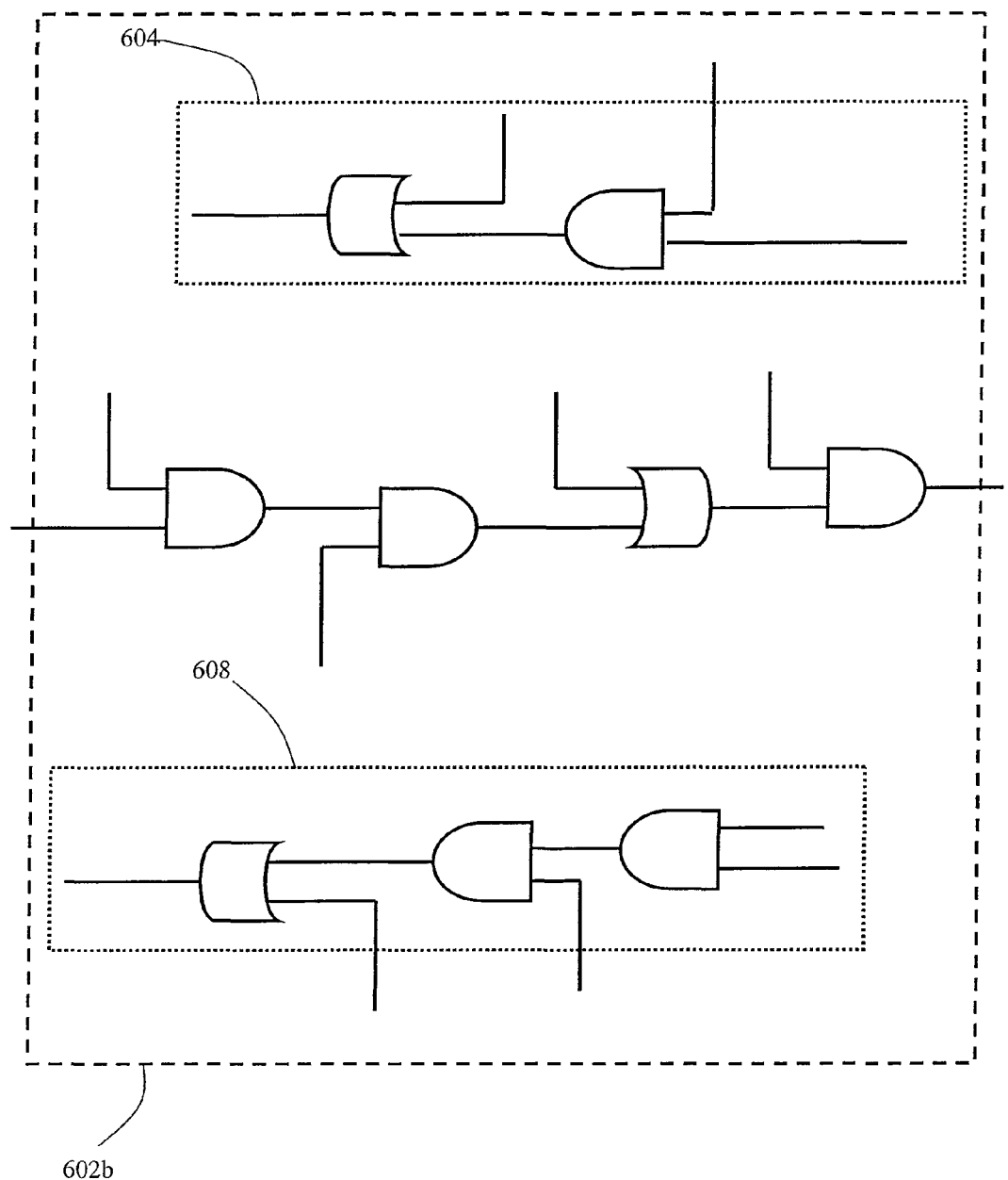

With embodiments of the present invention, the potential signal integrity effects are identified early enough such that nets 604 and 608 are added to expanded analysis cone 602b as shown in FIG. 6B. During timing analysis and optimization, any modifications to structures within analysis cone 602b can now be analyzed with respect to its effect upon nets 604 and 608. To the extent such modifications could negatively affect timing and signal integrity for nets 604 and 608, then those modifications will be identified as not being appropriate and will no longer be made.

Figure 7:
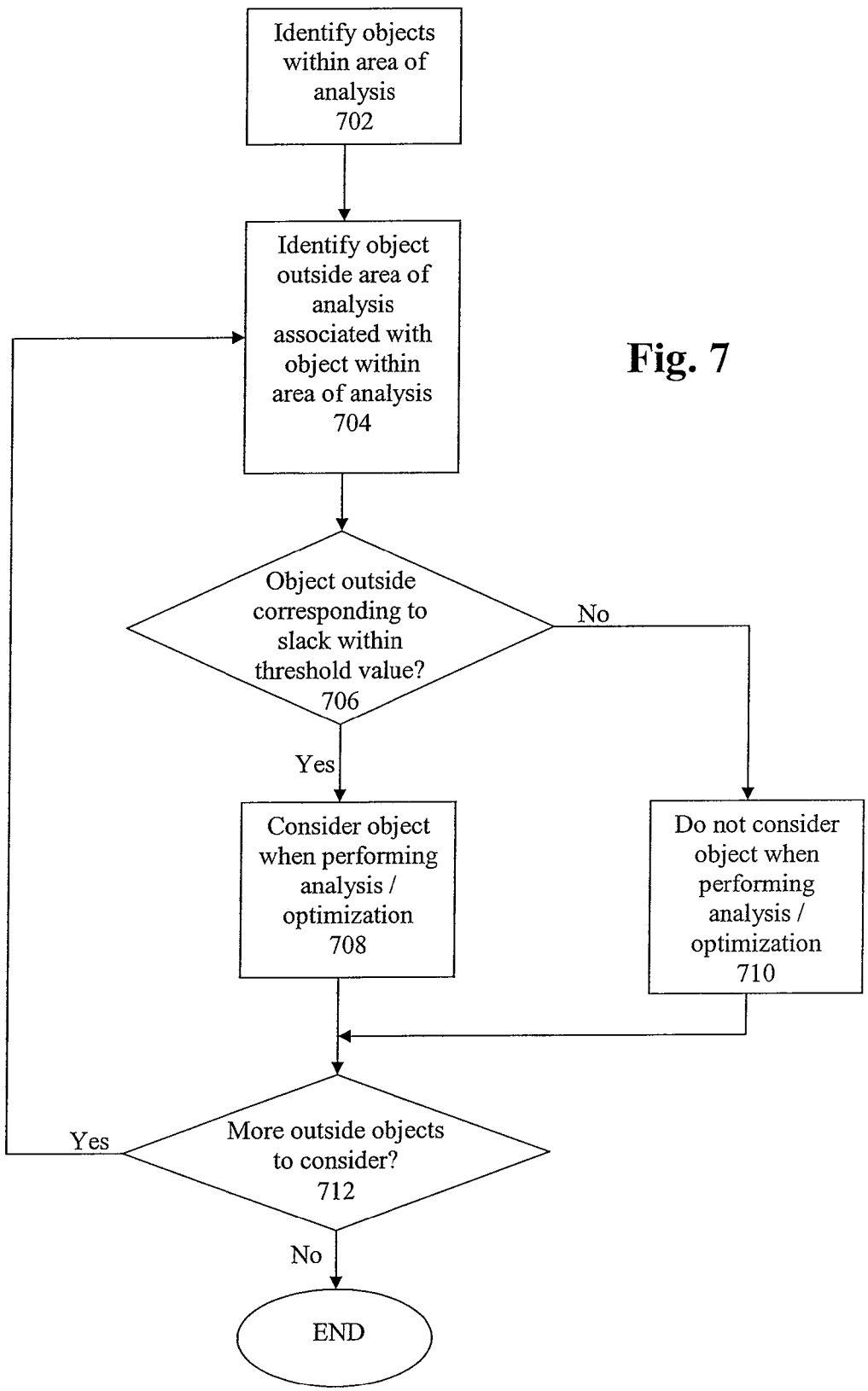
FIG. 7 shows a flow for extending an analysis cones based upon slack analysis according to some embodiments of the invention.

FIG. 7 shows a flowchart of an approach for considering circuit slack when expanding an analysis cone according to some embodiment of the invention. Slack is the margin by which a timing requirement is met or not met by a circuit design or a portion of a circuit design. A positive slack indicates that the circuit has met the timing requirements with an indication of the amount by which timing requirements have been met. A negative slack indicates that the circuit has not met the timing requirements with an indication of the amount by which timing requirements have not been met.

Modifications made to objects within the analysis cone may negatively affect the slack of signal paths outside of the analysis cone. To the extent any of those external signal paths have slack values that are susceptible to being negatively affected by changes and modification to the analysis cone, then it would be beneficial to preemptively identify those signal paths and to consider those signal paths when making timing optimizations to the analysis cone.

At 702, identification is made of objects within the analysis cone. If the analysis cone includes sequences of logic gates, then action 702 will identify at least those logic gates. Next, identification is made of signal paths outside of the analysis cone that are associated with objects within the analysis cone (704). If the analysis cone includes gates having multiple inputs and outputs, then it is likely that some of those inputs or outputs lead to associated signal paths that are outside of the analysis cone.

A threshold slack value is selected for the analysis. The threshold slack value is selected to identify any positive slack signal paths that have a low enough slack value such that slight negative effects will likely or possibly result in negative slack along those signal paths. As before, the goal is to minimize the amount of the design that must be analyzed and optimized, while still taking into account any significant and/or appreciable effects upon other portions of the circuit design. To minimize the quantity of additional signal paths that must be considered, a conservative analysis process will require selection of a fairly low threshold slack value which will result in less additional signal paths being considered. A more aggressive approach will require selection of a fairly high threshold slack value, which will result in greater numbers of additional signal paths that must be considered.

For each identified signal path, a determination is made whether the identified signal path is associated with slack that is within a threshold slack value (706). If so, then the signal path will be considered during optimization by being added to the expanded analysis cone (708). If not, then the signal path will not be added to the analysis cone (710).

The process will then determine whether there are any additional signal paths that have been identified as being outside of the analysis area of the analysis cone but are associated with the analysis cone (712). If so, then return back to 704 to continue processing the identified signal path(s).

FIG. 8 provides an illustrated example of the process of FIG. 7 for considering slack when expanding an analysis cone. The approach starts by identifying objects within the analysis cone, and then identifying signal paths outside of the analysis area of the analysis cone that are associated with the analysis cone.

In the example of FIG. 8, an analysis cone 802a has been identified that is associated with external signal paths 804, 806, 808, and 810. Each signal paths has a corresponding slack value. Signal path 804 corresponds to a positive 0.3 slack value. Signal path 806 corresponds to a positive 1.0 slack value. Signal path 808 corresponds to a positive 0.2 slack value. Signal path 810 corresponds to a positive 1.2 slack value.

Assume that a threshold slack value of positive 0.5 has been selected for the present example. Each external signal path is reviewed to determine if it is associated with a slack value that is within the threshold slack value. In the present example, external signal paths 804 and 808, having slack values of 0.3 and 0.2 respectively, are identified as being within the threshold slack value of 0.5. External signal paths 806 and 810, having slack values of 1.0 and 1.2 respectively, are not within the threshold slack value since they exceed the threshold value of 0.5.

Therefore, as shown in the bottom of FIG. 8, analysis cone 802a can be expanded as analysis cone 802b to include consideration of the additional external signal paths 804 and 808. During timing analysis and optimization, any modifications to analysis cone 802b can now be analyzed with respect to its effect upon signal paths 804 and 808. To the extent such modifications could negatively affect timing for signal paths 804 and 808, then those modifications will no longer be made.

Figure 9:
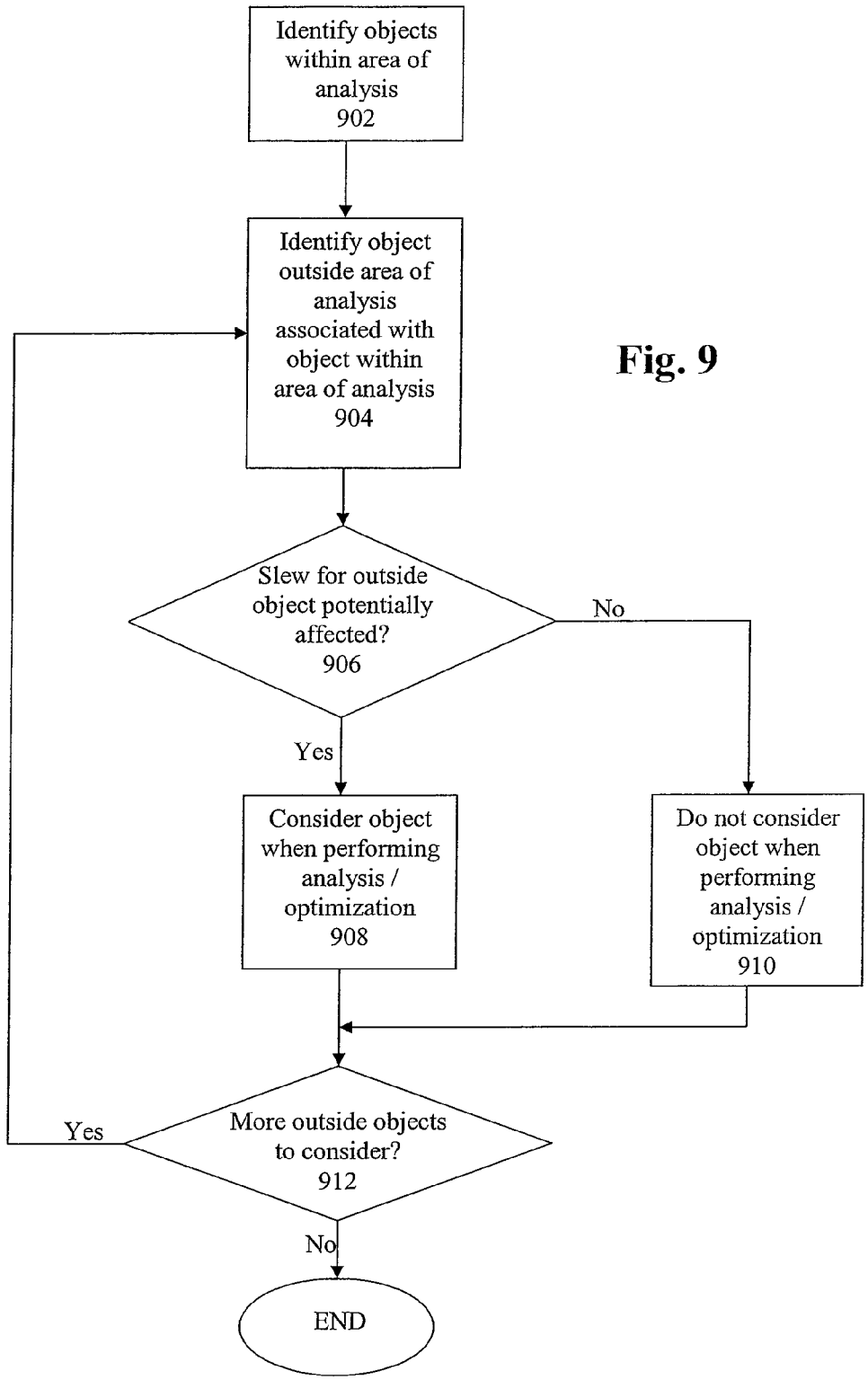
FIG. 9 shows a flow for extending an analysis cones based upon slew rate analysis according to some embodiments of the invention.

FIG. 9 shows a flowchart of an approach for considering circuit slew rates when expanding an analysis cone according to some embodiment of the invention. The slew rate represents the maximum rate of change of signal at any point in a circuit. Limitations in slew rate capability can give rise to non linear effects in many types of circuits.

Many types of timing analysis procedures involve propagations of worst case values, including delay and slew values, throughout a circuit. The issue being considered is that modifications made to objects within the analysis cone may change a slew value that is propagated through parts of the circuit that are outside of the analysis cone. To the extent any of those external objects/paths have circuit parameters that are susceptible to being negatively affected by a change in slew value, then those objects/paths are identified and are considered when making timing optimizations to the analysis cone.

At 902, identification is made of objects within the analysis cone. If the analysis cone includes sequences of logic gates, then action 902 will identify at least those logic gates. Next, identification is made of objects and signal paths outside of the analysis cone that are associated with objects within the analysis cone (904). If the analysis cone includes gates having multiple inputs and outputs, then it is likely that some of those inputs or outputs lead to associated signal paths that are outside of the analysis cone.

The external object and/or signal path is examined to determine whether a modification made to the analysis cone could negatively affect propagated slew values for the external objects/paths (906). If so, then the object/path will be considered during optimization by being added to the expanded analysis cone (908). If not, then the object/path will not be added to the analysis cone (910).

The process will then determine whether there are any additional objects/paths that have been identified as being outside of the analysis area of the analysis cone but are associated with slew values that may be affected by changes to the analysis cone (912). If so, then return back to 904 to continue processing the identified objects and/or signal paths.

Figure 10:
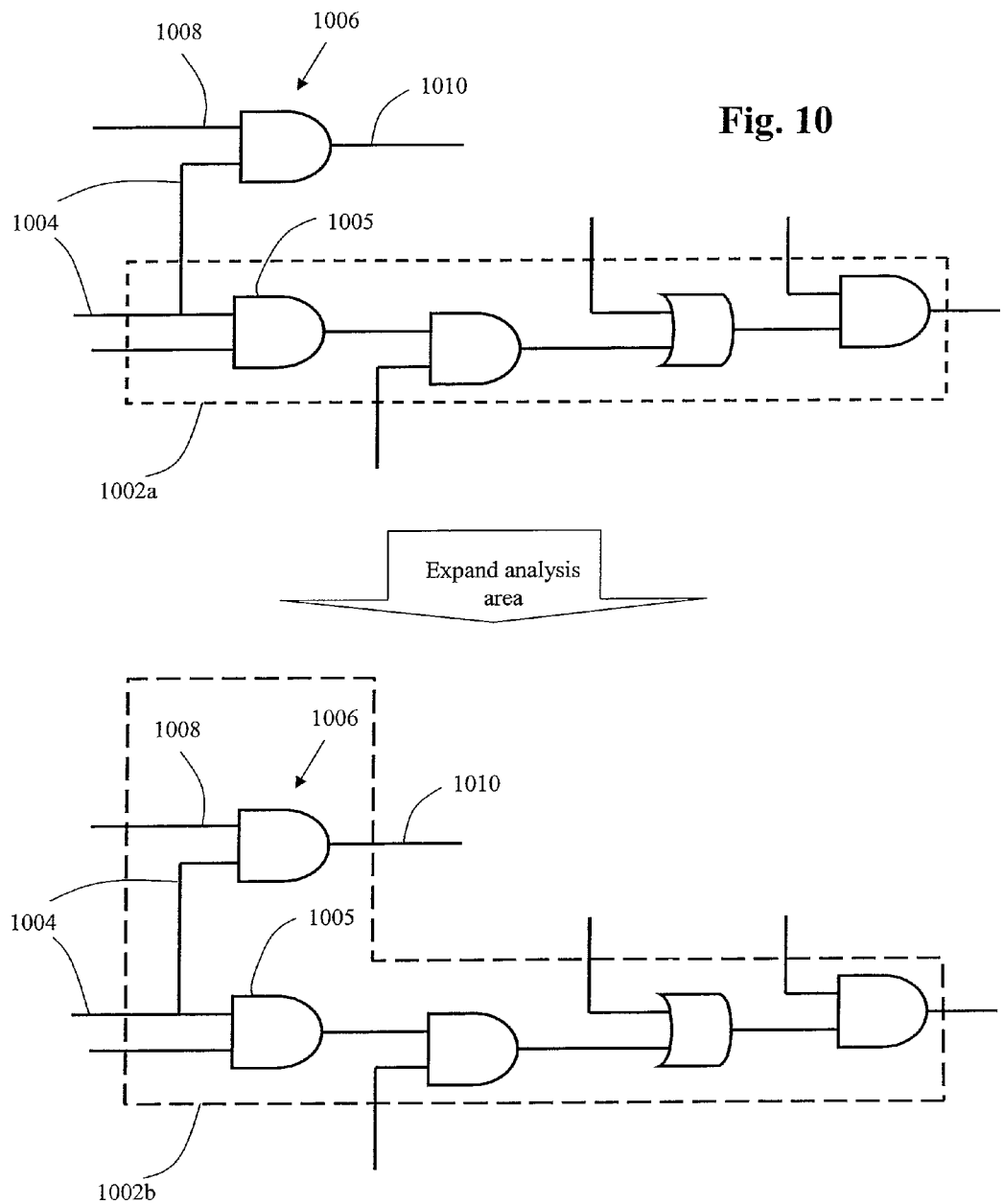
FIG. 10 illustrate a circuit portion for analysis and optimization that is extended based upon slew rates according to some embodiments of the invention.

FIG. 10 provides an illustrated example of the process of FIG. 9 for considering slew rates when expanding an analysis cone. The approach starts by identifying objects within the analysis cone, and then identifying objects or signal paths outside of the analysis area of the analysis cone that are associated possible slew rate issues based upon modifications to the analysis cone.

In the example of FIG. 10, an analysis cone 1002a has been identified that includes a gate 1005 having an input connection 1004. Input connection 1004 is also an input to gate 1006 that is outside of analysis cone 1002a. In this example, it is possible that a timing optimization is made that would affect the slew rate to input connection 1004. The problem is that a change to the slew rate for input connection 1004 could propagate through gate 1006, which could negatively affect the signal path associated with gate 1006 that is external to analysis cone 1002a.

If the EDA tool only considers the objects within analysis cone 1002a when performing timing optimization, and does not consider objects outside of the analysis cone 1002a, then this potential problem will not be identified and could result in greater downstream problems that would be significantly expensive to correct. With embodiments of the present invention, the potential slew problem is preemptively identified. As shown in the bottom portion of FIG. 10, analysis cone 1002a can be expanded as analysis cone 1002b to include the additional gate 1006 that is connected to input connection 1004. During timing analysis and optimization, any modifications to the slew rate for input 1004 can now be analyzed with respect to its effect upon gate 1006 and/or the rest of its signal path. To the extent such modifications could negatively affect timing for gate 1006 or its signal path, then that problematic modification can be avoided.

Figure 11:
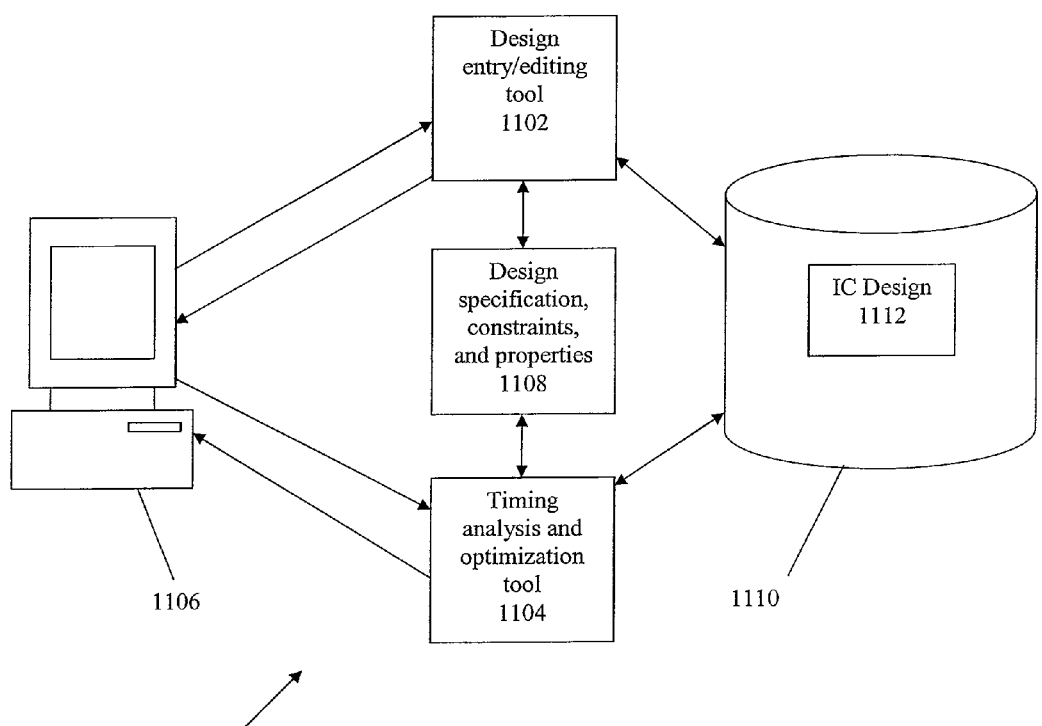
FIG. 11 illustrates a system having EDA tools for implementing embodiments of the invention.

FIG. 11 shows an example system 1100 for implementing a timing analysis and optimization according to embodiments of the invention. One or more design entry and/or editing tools 1102 are used by one or more users at user station 1106 to design, edit, and/or revision of an electronic design 1112. The one or more design entry/editing tools 1102 are used to address the hardware and/or software components within the electronic design according to the design specifications, constraints, and properties 1108.

One or more timing analysis/optimization tools 1104 are employed to perform timing analysis and/or timing optimization functions upon the electronic design 1112 created and edited by the design editing tool 1102. The components to perform partition-based analysis, and to analyze and expand analysis cones described herein may be incorporated into timing analysis/optimization tool 1104. The timing analysis and optimization functions are performed based upon timing constraints identified in the design specifications/constraints/properties 1108.

The electronic designs 1112 may be stored in a data storage device 1110. The data storage device 1110 may be used to store the electronic design at different levels of abstraction. Both the design editing tool 1102 and the users have access to one or more design specifications 1108 to guide the formation of the electronic design.

Figure 12:
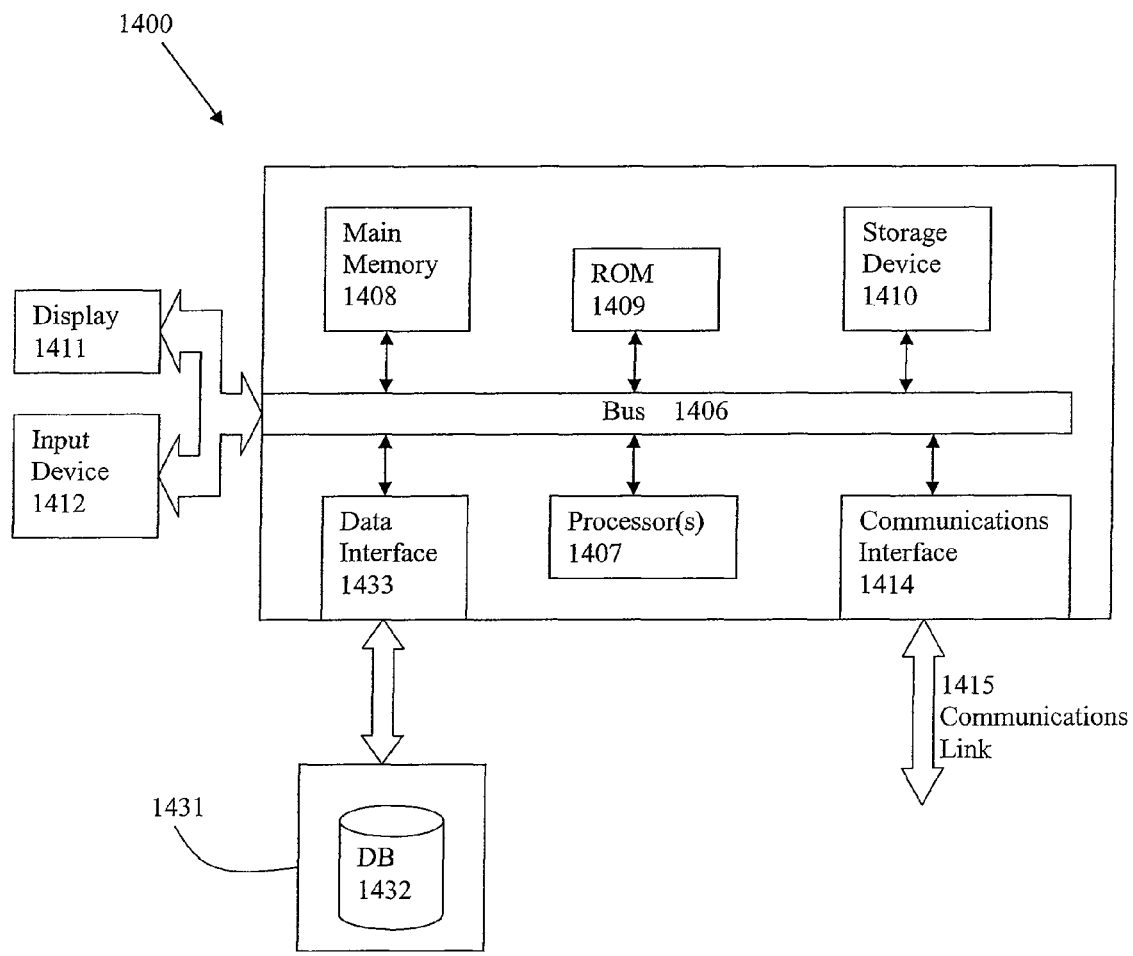
FIG. 12 shows an architecture of an example computing system with which the invention may be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A method for performing timing operations upon an electronic design, comprising:
   identifying an analysis cone within an electronic design, the analysis cone comprising a portion of the electronic design that can be discretely analyzed or optimized for timing within the electronic design;
   determining, by using a processor, one or more additional portions of the electronic design that are potentially affected by an optimization made for timing to one or more structures within the analysis cone, wherein the one or more additional portions that affects the timing are identified based at least in part upon the optimization of the one or more structures within the analysis cone such that unintended problems caused by the optimization are identified; and
   expanding the analysis cone to create an expanded analysis cone that includes the one or more additional portions of the electronic design that are potentially affected by the optimization made for timing to the one or more structures within the analysis cone.

2. The method of claim 1 in which the one or more additional portions of the electronic design that are potentially affected by the optimization made for timing to the one or more structures within the analysis cone is determined by considering design connectivity of the one or more structures within the analysis cone to structures outside of the analysis cone.

3. The method of claim 2 in which the structures outside of the analysis cone are physically connected to the one or more structures within the analysis cone, wherein one or more timing attributes of paths or nets associated with the structures outside of the analysis cone are negatively affected by changes made to the one or more structures within the analysis cone.

4. The method of claim 2 in which the one or more structures within the analysis cone that are physically connected to the structures outside of the analysis cone are designated as ineligible or of lower priority for modification when performing timing optimization.

5. The method of claim 1 in which the one or more additional portions of the electronic design that are potentially affected by the optimization made for timing to the one or more structures within the analysis cone is determined by considering signal integrity of a signal path outside of the analysis cone associated with the one or more additional portions.

6. The method of claim 5 in which signal integrity is considered by identifying a potential victim net outside of the analysis cone.

7. The method of claim 6 in which the potential victim net is identified based upon consideration of a threshold distance between the potential victim net and the one or more structures within the analysis cone.

8. The method of claim 6 in which the potential victim net is identified based upon consideration of a electrical analysis between the potential victim net and the one or more structures within the analysis cone.

9. The method of claim 1 in which the one or more additional portions of the electronic design that are potentially affected by the optimization made for timing to the one or more structures within the analysis cone is determined by considering circuit slack associated with the one or more additional portions of the electronic design outside of the analysis cone.

10. The method of claim 9 in which the one or more additional portions of the electronic design is identified based upon a circuit slack value that is within a defined threshold slack value.

11. The method of claim 1 in which the one or more additional portions of the electronic design that are potentially affected by the optimization made for timing to the one or more structures within the analysis cone is determined by considering circuit slew associated with the one or more additional portions of the electronic design outside of the analysis cone.

12. The method of claim 11 in which the one or more additional portions of the electronic design is identified based likelihood that the circuit slew associated with the one or more additional portions of the electronic design outside of the analysis cone will be negatively affected by a timing optimization made within the analysis cone.

13. The method of claim 1 is embodied embodies as executable program code on a non-transitory computer readable medium which, when executed by the processor, causes the processor to execute the code.

14. A system for performing timing operations upon an electronic design, the system comprising:
   a computer readable medium for storing an electronic design, wherein the electronic design comprises data corresponding to the design of an electronic device;
   a processor for executing program code;
   a program in execution using the processor, the program controlling the system to identify an analysis cone within an electronic design, the analysis cone comprising a portion of the electronic design that can be discretely analyzed or optimized for timing within the electronic design, and further determining one or more additional portions of the electronic design that are potentially affected by an optimization made for timing to one or more structures within the analysis cone, wherein the one or more additional portions that affects the timing are identified based at least in part upon the optimization of the one or more structures within the analysis cone such that unintended problems caused by the optimization are identified; and thereafter expanding the analysis cone to create an expanded analysis cone that includes the one or more additional portions of the electronic design that are potentially affected by the optimization made for timing to the one or more structures within the analysis cone.

15. The system of claim 14 in which the one or more additional portions of the electronic design that are potentially affected by the optimization made for timing to the one or more structures within the analysis cone is determined by considering design connectivity of the one or more structures within the analysis cone to structures outside of the analysis cone.

16. The system of claim 15 in which the structures outside of the analysis cone are physically connected to the one or more structures within the analysis cone, wherein one or more timing attributes of paths or nets associated with the structures outside of the analysis cone are negatively affected by changes made to the one or more structures within the analysis cone.

17. The system of claim 14 in which the one or more additional portions of the electronic design that are potentially affected by the optimization made for timing to the one or more structures within the analysis cone is determined by considering signal integrity of a signal path outside of the analysis cone associated with the one or more additional portions.

18. The system of claim 17 in which signal integrity is considered by identifying a potential victim net outside of the analysis cone.

19. The system of claim 14 in which the one or more additional portions of the electronic design that are potentially affected by the optimization made for timing to the one or more structures within the analysis cone is determined by considering circuit slack associated with the one or more additional portions of the electronic design outside of the analysis cone.

20. The system of claim 19 in which the one or more additional portions of the electronic design is identified based upon a circuit slack value that is within a defined threshold slack value.

21. The system of claim 14 in which the one or more additional portions of the electronic design that are potentially affected by the optimization made for timing to the one or more structures within the analysis cone is determined by considering circuit slew associated with the one or more additional portions of the electronic design outside of the analysis cone.

22. The system of claim 21 in which the one or more additional portions of the electronic design is identified based likelihood that the circuit slew associated with the one or more additional portions of the electronic design outside of the analysis cone will be negatively affected by a timing optimization made within the analysis cone.

23. A method for performing timing operations upon an electronic design, comprising:
    identifying an analysis partition of an electronic design, the analysis partition comprising a portion of the electronic design that can be separately analyzed or optimized for timing within the electronic design;
    determining, by using a processor, one or more additional portions of the electronic design that are potentially affected by an optimization made for timing to one or more structures within the analysis partition, wherein the one or more additional portions that affects the timing are identified based at least in part upon the optimization of the one or more structures within the analysis cone such that unintended problems caused by the optimization are identified; and
    expanding the analysis partition to create an expanded analysis partition that includes the one or more additional portions of the electronic design that are potentially affected by the optimization made for timing to the one or more structures within the analysis partition.

24. The method of claim 23 in which the one or more additional portions of the electronic design that are potentially affected by the optimization made for timing to the one or more structures within the analysis partition is determined by considering design connectivity, signal integrity, circuit slack, or circuit slew associated with the one or more additional portions of the electronic design outside of the analysis partition.

25. The method of claim 23 the one or more structures within the analysis partition that correspond to structures outside of the analysis partition identified based upon consideration of design connectivity, signal integrity, circuit slack, or circuit slew are designated as ineligible or of lower priority for modification when performing timing optimization.

* * * * *